(12) United States Patent
Ryum et al.

(10) Patent No.: US 6,462,397 B2
(45) Date of Patent: Oct. 8, 2002

(54) BIPOLAR JUNCTION DEVICE

(75) Inventors: Byung Ryul Ryum; Tae Hyeon Han; Soo Min Lee; Deok Ho Cho, all of Daejeon Kwangyeok-shi (KR)

(73) Assignee: ASB, Inc., Taejon (KR)

( * ) Notice: Subject to any disclaimer, the term of this patent is extended or adjusted under 35 U.S.C. 154(b) by 0 days.

(21) Appl. No.: 10/027,583

(22) Filed: Oct. 22, 2001

(65) Prior Publication Data

US 2002/0058388 A1 May 16, 2002

Related U.S. Application Data

(62) Division of application No. 09/469,395, filed on Dec. 22, 1999.

(30) Foreign Application Priority Data

Sep. 7, 1999 (KR) ..................................... 1999-0037911

(51) Int. Cl.[7] ............................................. H01L 27/082
(52) U.S. Cl. ....................... 257/565; 257/575; 257/578; 438/205; 438/313; 438/340
(58) Field of Search ................................. 438/309, 312, 438/313, 318, 320, 322–327; 257/197, 565, 200, 201, 370, 378, 474, 330–335

(56) References Cited

U.S. PATENT DOCUMENTS 6,208,012 B1 * 2/2001 Oshi .......................... 257/565

* cited by examiner

*Primary Examiner*—David Nelms
*Assistant Examiner*—D. Le
(74) *Attorney, Agent, or Firm*—Jacobson Holman, PLLC

(57) ABSTRACT

The present invention is related to a bipolar transistor in which the in-situ doped epitaxial Si or SiGe base layer is used instead of using an ion-implanted Si base, in order to achieve higher cutoff frequency. The SiGe base having the narrower energy bandgap than the Si emitter allows to enhance the current gain, the cutoff frequency($f_T$), and the maximum oscillation frequency ($f_{max}$). The narrow bandgap SiGe base also allows to have higher base doping concentration. As a result, the intrinsic base resistance is lowered and the noise figure is thus lowered. Parasitic base resistance is also minimized by using a metallic silicide base ohmic electrode. The present invention is focused on low cost, high repeatability and reliability by simplifying the manufacturing process step.

6 Claims, 12 Drawing Sheets

BIPOLAR JUNCTION DEVICE

CROSS REFERENCE TO RELATED APPLICATIONS

The present application is a divisional of Ser. No. 09/469,395, filed Dec. 22, 1999 and Applicant hereby claims priority thereto under 35 USC 120. Furthermore. Applicant also claims priority under 35 USC 119 based upon Korean patent application no. 10-1999-0037911, filed Sep. 7, 1999.

BACKGROUND OF THE INVENTION

1. Field of the Invention

The present invention relates to bipolar junction elements like a junction diode or a junction transistor and a method for manufacturing thereof. Especially, the present invention relates to a bipolar transistor and a method for manufacturing the bipolar transistor in which a silicon or a silicon-germanium(SiGe) film is used for a base.

The field of semiconductor with highly advanced technology can be divided into the field of memory, the field of system integrated circuit(IC) which is represented by application specific integrated circuit (ASIC), the field of radio frequency integrated circuit (RFIC) which is essential in wireless communication, and the field of high speed digital & analog integrated circuit for data process. Among these fields of semiconductor, the present invention is especially related to the semiconductor element having high maximum oscillation frequency($f_{max}$) and high cut-off frequency($f_T$) which are related to the field of RFICs and the high speed digital & analog ICs. As we live in the era where wireless communication is widely used and where its need is increasing explosively, the need of high frequency elements is rising as the quality of communication improves and the markets of higher frequency band providing various communication services and large number of subscribers increase. Also, as the need of super speed information communication network increases in the contemporary society, researches and developments of a high speed transistor are carried on actively. At present, 10 Gbps integrated circuit using high speed transistor about 60 GHz is developed in the usage of optical communications and is at the stage of being commonly used. The silicon homo bipolar junction transistor which includes the silicon base layer formed by ion-implanting a dopant has maximum $f_T$ of 30 GHz at most. The heterojunction bipolar transistor(HBT) having an epitaxially grown SiGe base layer exhibits maximum $f_T$ in the range of 50~150 GHz and $f_{max}$ of 50~160 GHz.

The SiGe has a narrower energy bandgap($E_g$) than that of the silicon. The energy bandgap difference($\Delta E_g$) between the silicon emitter and the SiGe base enhances the current gain exponentially, and the $f_T$ and the $f_{max}$ also increase compared to the homojunction bipolar transistor. Therefore, the impurity doping concentration into the SiGe base can be increased in the margin of exp ($\Delta E_g$) without degrading the current gain. The base resistance is lowered and consequently the noise figure is lowered. Furthermore, it is possible for power consumption to be lowered because the bias current achieving the same $f_T$ decreases. In comparison with the base of the transistor formed by ion-implanting in the conventional method, the base formed by the epitaxial growth method can be much thinner to the degree of 200 Å approximately and consequently the cut-off frequency increases. Since the Ge composition in the SiGe base from the emitter side to the collector side ramps up linearly, the electrons transiting to the base accelerate. Therefore, the $f_T$ and $f_{max}$ can be further increased by grading the Ge content. The SiGe HBT is fully process-compatible with silicon devices. Furthermore, it allows to achieve higher $f_T$ and $f_{max}$ than 100 GHz using 0.8~1 μm of photolithography. This means that, contrast to memory and ASIC getting highly scale-down to 0.18~0.25 μm, SiGe HBTs can be fabricated by recycling the out-of-date production facilities at the 0.8~1 μm level. Therefore, it has good economic value with high output.

2. Description of the Prior Art

There are several registered patents showing related arts of SiGe HBT from IBM in the United States, NEC, Hitachi, and SONY in Japan, TEMIC in Germany, and Electronics and Telecommunications Research Institute(ETRI) in Korea. The structural characteristics and drawbacks of the related arts will be given in the followings.

First, the prior art of NEC in Japan is a kind of the super self-aligned NPN HBT. In this particular transistor, the base layer including SiGe is selectively grown in the device active region and each of the collector-base and the emitter-base junctions is self-aligned. The method for manufacturing this super self-aligned will be described herein below.

In FIG. 1a, a n+ type buried collector 11 is formed by ion-implanting n+ type impurity (dopant) into a p– type silicon substrate 1. A collector layer 10 is deposited on the resulting structure. A collector sinker 13 which connects the buried collector 11 and a collector semiconductor electrode to be formed afterward is formed by implanting n+ type impurity ions into the region as shown in the figure. A trench is formed by etching the collector layer 10 and the substrate 1 in order to isolate the neighboring transistors electrically. The isolation trench 71 is filled with an insulation material like boron phosphorous silica glass (BPSG). Then, the surface of the isolation trench 71 is planarized by a chemical-mechanical polishing (CMP) of the BSPG so that the surface of the isolation trench 71 becomes a same height with the surface of the collector layer 10. Form a collector insulation layer 17 with silicon oxide layer, a base semiconductor electrode 23 with p+ type polysilicon film, and an emitter insulation layer 37 with silicon nitride film by sequentially depositing on the substrate 1 where the collector layer 10 and the isolation trench 71 are formed. The collector insulation layer 17 in the region which is planned to be the emitter is exposed by etching the emitter insulation layer 37 and the base semiconductor electrode 23. Then, by depositing an insulation layer and etching it anisotropically, a first side-wall insulation layer 73 is formed at the inner side-wall of the base semiconductor electrode 23 and the emitter insulation layer 37. Wet etch the exposed collector insulation layer 17 in order to expose the collector layer 10 beneath the collector insulation layer 17. Even after the collector layer 10 is exposed, continue the wet etching to form an undercut 27a to the pre-determined depth beneath the base semiconductor electrode 23. The n type impurity ions are added selectively to the intrinsic collector region 15 by ion-implanting to the resulting structure in order to increase the cut-off frequency.

In FIG. 1b, a base layer 20 composed of an undoped SiGe, a p+ SiGe layer, and an undoped Si layer which is supposed to be the emitter 35 later on is grown selectively on the exposed collector layer 10 and beneath the exposed base semiconductor electrode 23 in the undercut 27a. Here, a base connecting part 27b which is selectively deposited beneath the base semiconductor electrode 23 is a polycrystalline while the base layer 20 on the collector layer 10 is single crystalline. A silicon film is further selectively grown thereon in order to make sure the connection between the base semiconductor electrode 23 and the base layer 20. At this step, growth rate of the single crystalline silicon layer on the base layer 20 is controlled to be much slower than that of the poly-crystalline base connecting part 27b, so that the thickness variation of the undoped Si layer at the top of the base layer 20 is minimized. The second side-wall insulation layer 75 which covers the first side-wall insulation layer 73 and which contacts with a part of the base layer 20 is formed by depositing the insulation material like a silicon nitride film and by etching it anisotropically. Then, expose the collector sinker 13 by partially opening the collector insulation layer 17. An n type polysilicon layer is deposited on the resulting structure. Then it is patterned to form an emitter semiconductor electrode 33 on the base layer 20 and a collector semiconductor electrode 13a on the collector sinker 13. Diffuse the impurity in the emitter semiconductor electrode 33 into the undoped Si layer by thermal annealing, at the upper-most part of the base 20 to form an n type emitter 35. The remaining part of the base 20 is the intrinsic base layer 25. As a result, a super self-aligned transistor in which the collector-base part is self-aligned through the undercut and in which the emitter-base part is self aligned through the first and the second side-walls is formed without using masks.

Since the depth of the undercut 27a is controlled by the wet etching time, it is difficult to get a good uniformity of the collector-base junction parasitic capacitance which is determined by the depth. When the base layer is selectively grown on the collector layer in the oxide-patterned wafer, the thickness of the base layer, the doping concentration in the base layer, and Ge concentration in the SiGe layer vary according to the density and size of the exposed part of the collector layer. This effect, so called loading effect, can lower process stability and lead to non-uniform device performance within the wafer. In order to lower the loading effect, the growing pressure of the base layer has to be decreased. However, the throughput is lowered in this case. In this prior art, the base electrode is composed with p+ polysilicon. As the parasitic resistance of the p+ polysilicon is bigger than a metal, it obstructs the $f_{max}$ being increased.

The second related art owned by the IBM in the U.S.A. is about a SiGe HBT with a titanium silicide layer which is used as an ohmic electrode at the emitter, the base and the collector, as shown in FIG. 2, to reduce the parasitic resistances in the emitter, the base and the collector. The method for manufacturing thereof will be briefly given hereinafter.

In FIG. 2a, a buried collector 11 is formed by implanting an n+ type impurity into a p-type silicone substrate 1. A collector layer 10 is formed by depositing a silicon thereon. A trench is formed by etching the substrate 1 and the collector layer 10 for device isolation. An insulation layer is formed with insulation material like a silicon oxide at the inner, side of the trench. A polysilicon is filled into the rest of the inner side of the trench and planarized by chemical-mechanical polishing. As a result, the polysilicon-filled trench isolation 71 is formed. A collector insulation layer (field oxide film) 17 is formed by the recessed local oxidation of silicon (recessed LOCOS). In this method, the part excluding the active region of the collector layer 10 is etched to a pre-determined depth and the part of the collector layer excluding already etched part is thermally oxidized. In other words, the collector insulation layer 17 is thermally oxidized. In other words, the collector insulation layer 17 is formed only in the region of the collector layer 10 excluding the collector sinker 13 which will be formed and the collector 15 on which emitter will be formed. An n+ type collector sinker 13 is formed by implanting n type impurity ions into a part of the collector layer 10 using a photoresistor and the collector insulation layer 37 as masks. On the resulting structure, a base layer including a p+ SiGe layer and undoped Si layer is grown at the top of the base layer which becomes an emitter at the diffusing of an n type impurity afterwards. At this step, mono-crystalline base layer to be used as a base 25 is deposited on the active collector 15 while poly-crystalline or amorphous base layer to be used as the base semiconductor electrode 23 is deposited on the collector insulation layer 17. The outer part of the base semiconductor electrode is etched off using a photoresistor mask. An emitter insulation layer 37 like a silicon oxide is deposited. An emitter region is opened by eliminating the part corresponding to the active collector 15 and the base 25 of the emitter insulation layer 37 using a photo resistor mask.

In FIG. 2b, an emitter semiconductor electrode 33 is formed by depositing and patterning an n+ polysilicon. A side-wall silicon oxide film 77 is formed at the outer side of the emitter semiconductor electrode 33 by depositing silicon oxide material and etching it anisotropically. By further anisotropic oxide etching, the emitter insulation layer 37 on the base semiconductor electrode 23 is eliminated.

Using a selective titanium silicide formation only on the silicon surface, a collector ohmic electrode 19, a base ohmic electrode 29, and an emitter ohmic electrode 39 are formed simultaneously. In the present device, the contact resistance and the base parasitic resistance is reduced by the metallic silicide ohmic electrodes 19, 29, 39 on the semiconductor electrodes.

In this case, in order for the emitter metal electrode to be formed on the emitter ohmic electrode, the size of the emitter ohmic electrode should be bigger than that of the emitter metal electrode. The narrower the emitter is, the higher the $f_T$ and the $f_{max}$ are. Therefore the edge of the emitter should be apart from the edge of the base ohmic electrode to a distance L. In other words, the edge of the intrinsic base beneath the emitter is apart from the edge of the base ohmic electrode in the distance of L. Accordingly, occurrence of the parasitic resistance at the extrinsic base region with the length of L is unavoidable. In order to reduce the emitter contact resistance, emitter ohmic electrode should be larger, but the length of L becomes larger. For this reason, there is difficulty in scaling down the device for higher speed and lower power consumption. Extending the emitter ohmic electrode to the outside of the active device region in order for the emitter metal electrode to be contacted thereon could be one way of overcoming this difficulty. In this case the parasitic emitter resistance occurres at the extended part of the emitter ohmic electrode.

The titanium disilicide base ohmic electrode formed by sputtering the titanium and by reacting it with the silicon underneath agglomerates during the silicide formation so, the titanium disilicide layer may penetrate through the thin base layer and contact the collector layer and the cutoff frequency $f_T$ may be lowered. For this reason, it is risky to make the base layer thin unconditionally to achieve high $f_T$. In another way, the base ohmic layer should be formed only in the outside of the active device region at the expense of larger L. As a result, the base parasitic resistance increases and the device performance may be degraded.

In the third SiGe base bipolar device of FIG. 3 presented by TEMIC in Germany, a titanium disilicide layer 29 is used as a base ohmic electrode and self-aligned with an emitter semiconductor electrode 33. The manufacturing method is described briefly in the followings.

In FIG. 3a, a buried collector 11 is formed by implanting n-type impurity ions into a p-type silicon substrate 1. A collector layer is deposited thereon. A collector insulation layer 17 is formed by LOCOS process. The layer 17 is not formed in an active collector region 15 and a collector sinker 13. A base layer with p+ type SiGe and an emitter layer with an n-type silicon are sequentially deposited thereon. A part of this layer deposited on the active collector region 15 is a single crystalline while the other part of it deposited on the collector insulation layer (field oxide layer) 17 is either a poly-crystalline or amorphous. An emitter insulation layer 37 with silicon oxide and a silicon nitride layer are sequentially deposited on the resulting structure. Then, a masking film 91 is formed by patterning the silicon nitride layer using a photo-mask which covers the emitter region. The n-type silicon emitter layer outside the emitter region is converted to a p++ type first base semiconductor electrode film 21a By implanting $BF_2$ ion thereon and annealing. The n-type silicon emitter layer inside the emitter region, i.e. intrinsic emitter layer 35, remains unchanged. At the same time, the p+SiGe base layer outside the masking layer becomes a p++ second base semiconductor electrode film 21b while the p+ SiGe base layer beneath the intrinsic emitter layer 35, i.e. intrinsic base layer 25, remains unchanged. The B(boron) diffuses and thereby a pedestal p++ region 27 is formed along with the inner periphery of the active collector region 15, during the thermal annealing which follows the $BF_2$ implantation.

In FIG. 3b, a first and a second base semiconductor electrode, 23a and 23b respectively, are completely formed by patterning the films 21a and 21b using a photo-mask which defines the base electrode region. A first insulating side-wall 73 is formed at the side-walls of the nitride masking film 91 and the base semiconductor electrodes consisting of 23a and 23b, by depositing a silicon oxidation layer and anisotropically etching. A part of emitter insulation layer 37 uncovered by the masking film 91 and the first insulating side-wall are further eliminated by the anisotropic etching. Then, a titanium-silicide base ohmic electrode 29 and collector ohmic electrode 19 are formed selectively only on the upper part of the exposed first semiconductor electrode 23a and the collector sinker 13. A protection layer 79 like a silicon oxide layer is deposited on the resulting substrate. The protection layer 79 is planarized by a chemical mechanical polishing(CMP) until the top surface of the masking film 91 is exposed.

The masking layer 91 is selectively etched off. A second side insulation layer 75 is formed at the inner side of the first side insulation layer 73. A part of the emitter insulation layer 37 is hence exposed and then eliminated by etching so that the n-type silicon emitter layer is opened. An emitter semiconductor electrode 33 is formed by depositing and patterning an n+ type poly-crystalline silicon using a photo-mask. An emitter ohmic electrode 39 is selectively formed with a titanium disilicide only on the emitter semiconductor electrode 33, by sputtering a titanium and thermal annealing. Metal contact windows of the base ohmic electrode 29 and the collector ohmic electrode 19 are opened by patterning the protection layer 79 using a photo-mask. A base terminal 81, an emitter terminal 83, and a collector terminal 85 are formed thereon by depositing and patterning the metal using a photo-mask.

In this method, at the thermal annealing step to activate the boron ions implanted in the base semiconductor electrode 23a and 23b, the boron ions in the p+ SiGe intrinsic base layer 25 diffuses vertically into the adjacent silicon layers; the intrinsic emitter layer 35 and the active collector layer 15. Therefore the base is thickened and cut-off frequency is lowered accordingly. At the same time, the boron implanted in the base semiconductor electrode 23a and 23b laterally diffuses and contacts the n type impurity which diffuses from the n+ type poly-crystalline silicon emitter semiconductor electrode 33. In this case, an n+/p++ emitter/base junction is made and a tunneling current, in other words, a leakage current occurs.

Since a polishing rate of a silicon oxide is almost the same to that of a silicon nitride in planarizing the protection layer 79 at the CMP step, it is difficult to stop the polishing process of the protection layer 79 when the top surface of the masking film 91 is exposed. The first insulating side-wall 73 may be over-polished and eliminate with the protection layer 79. Therefore, the base ohmic electrode 29 maybe in contact with the emitter semiconductor electrode 33. In addition, as the protection layer 79 outside the protruding part is also polished at the same time, it could be eliminated and hence the emitter semiconductor electrode 33 to be formed later could be in contact with the titanium disilicide base ohmic electrode 29. In order to avoid this kind of difficulty such as over-polishing of first insulating side-wall 73 and the protection layer 79 outside the protruding part, it is desirable to make the masking film 91 thicker. However, a thick silicon nitride film puts on lots of stress to the substrate when it is deposited. Therefore, there is little process control margin.

The fourth related art, as shown in FIG. 4, is a SiGe base bipolar transistor proposed by ETRI in Korea. The method for manufacturing thereof will be described briefly in the followings.

In FIG. 4a, an n+ buried collector 11 is formed by ion-implanting n type impurities into a p− type silicon substrate 1. A collector layer is formed with n-type silicon thereon. A collector insulation layer 17 is formed by applying LOCOS process to the region in which a collector active region 15 and a collector sinker 13 are not formed. An n+ collector sinker 13 is formed by implanting an n type impurity into a collector sinker region. A base layer 20 composed of three layers, an undoped SiGe, a p+ SiGe, and undoped Si layer from the bottom to the top, is deposited on the entire substrate 1 where the active collector region 15 and the collector sinker 13 are formed. At this process step, the crystallinity of the base layer 20 deposited on the active collector 15 and the collector sinker 13 is a single crystalline, while that on the collector insulation layer (field oxidation film) 17 is a poly-crystalline or an amorphous. A masking film 91 covering the collector sinker 13 and an active base region 25 within the active collector region 15 is formed by depositing and patterning a silicon oxide film on the base layer. The $BF_2$ ions are implanted to the exposed base layer using the masking film 91 as a mask. A heat treatment is followed in order to activate the implanted ions and re-crystallize the damaged silicon layer by the implanting. At the same time, the implanted impurity ions diffuse so that a p++ base semiconductor electrode film 21 and a p++ region 27 at the edge of the collector 15 region are formed. Then the masking film 91 is eliminated. An amorphous base ohmic electrode film 29 is deposited on the base layer by sputtering a composite metal like $TiSi_{2.6}$. A silicon oxide film 93 is further deposited on the base ohmic electrode film 29. A part of the silicon oxide film 93 on the active base 25 is etched using a photo-mask which opens the active base region 15. Then, the opened part of the base ohmic electrode film 29 is wet etched accordingly by a HF-base chemical solution. An emitter insulation layer 37 like a silicon oxide layer is deposited on the resulting substrate. The emitter insulation layer 37 and the silicon oxide film 93 are etched using a photomask covering the base electrode region. Then, the base ohmic electrode film 29 is wet-etched and the base layer 20 on collector insulation film 17 is dry-etched using the remaining emitter insulation layer 37 and the remaining silicon oxide film 93 as masks. A side-wall insulation layer 77 is formed at each of the etched side-wall of the emitter insulation layer 37, the silicon oxide film 93, the base ohmic electrode film 29, and the base semiconductor electrode 23. The emitter region is opened using a photomask by etching the emitter insulation layer 37 and consequently the active base layer 25 is exposed. An emitter semiconductor electrode 33 and a collector semiconductor electrode 13a are simultaneously formed on the active base layer 25 and the collector sinker 13 by depositing a polysilicon layer on the entire resulting substrate, implanting an n type impurity into the polysilicon layer, and patterning the polysilicon layer using a photomask. A passivation layer 79 is formed on the entire resulting substrate by depositing a silicon oxide. Then, by thermal annealing the substrate, the n type impurity in the emitter semiconductor electrode 33 is diffused into the adjacent layer so that the undoped Si layer, which is the upper layer of the active base layer, is converted to an emitter 35. By patterning the passivation layer 70 using a photomask, metal contact windows for the emitter, the base, and the collector are formed on the emitter semiconductor electrode 33, the base ohmic electrode 29, and collector semiconductor electrode 13a, respectively. Then, a metal film including TiW and A-1%Si is deposited and patterned using a phtomask defining metal interconnection. Consequently, an emitter terminal 83, a base terminal 81, and a collector terminal 85 are formed.

This related art also has drawbacks like other previously cited arts. First, when wet etching the amorphous $TiSi_{2.6}$ base ohmic electrode film 29 using a photo-mask which opens the active base region 15, the wet etch rate of the amorphous $TiSi_{2.6}$ base ohmic electrode film 29 is different from that of the silicon oxide film 93. Consequently, the side-wall of the etched active base region becomes so uneven that a void generation at the uneven side-wall is resulted when depositing the emitter insulation layer 37. When the polysilicon layer is deposited to be the emitter semiconductor electrode 33 later on, the void is filled with the polysilicon and therefore the emitter semiconductor electrode 33 is in contact with the base ohmic electrode. In addition, since the etching process inevitably introduces bubbles at the reacting surface of the amorphous $TiSi_{2.6}$ base ohmic electrode film 29, the bubbles prohibit the wet etchant from etching the amorphous $TiSi_{2.6}$ film. As a result, parts of the amorphous $TiSi_{2.6}$ film covered with the bubbles are etched insufficiently that the amorphous $TiSi_{2.6}$ residues may cause electrical contact between the emitter semiconductor electrode 33 and the base ohmic electrode film 29.

Second, when wet-etching the base ohmic electrode film 29 outside of the base electrode region using the emitter insulation layer 37 and the silicon oxide film 93 as masks, the difference of the etch rate difference between the silicon oxide and the amorphous $TiSi_{2.6}$ film results in the uneven side-wall again. When cleaning the resulting wafer using a diluted HF, the emitter insulation layer 37, the silicon oxide film 93, and the amorphous $TiSi_{2.6}$ film 29 are further etched so that the base electrode boundary become more unclear. That is, the base electrode formation process is not stable and therefore the resulting base electrode becomes degraded electrically.

SUMMARY OF THE INVENTION

As forementioned, there are drawbacks and problems in the cited arts of the SiGe base bipolar transistor. In order to achieve higher cutoff frequency in a bipolar transistor, it is appropriate to have the base layer as thin as possible. Since a titanium disilicide is likely to agglomerate, if the ultra thin base bipolar transistors is formed with the titanium base ohmic electrode, the titanium disilicide is likely to permeate the thin base layer and thus contact the collector layer. In order to avoid this problem, the titanium base ohmic electrode is formed on the base layer outside the active collector region in the prior art of FIG. 2 at the expense of longer L as illustrated in FIG. 2a. Another way is suggested in FIG. 4 to overcome this drawback. When wet etching the base electrode formed with amorphous $TiSi_{2.6}$, uniformity in the processing step cannot be guaranteed and an electrical contact is likely to occur between the base and the emitter due to the amorphous $TiSi_{2.6}$ residues at the etched surface of the active base region.

The object of the present invention is to provide an epitaxially grown Si- or SiGe-base bipolar transistor having a metallic silicide base ohmic layer to reduce the base electrode resistance and a manufacturing the method thereof without aforementioned drawbacks. According to the present invention, a homojunction or heterojunction bipolar transistor comprises of a semiconductor substrate having a buried collector; an active collector and a collector sinker thereon which are divided by a collector insulation film; a base layer divided into an active base layer on the active collector and a first base semiconductor electrode film on the collector insulation film; a second base semiconductor electrode film selectively grown only on the first base semiconductor electrode film by using a masking film; a metallic silicide base ohmic electrode film selectively formed on the second base semiconductor electrode film; an emitter insulation film isolating an emitter; an emitter formed on the active base layer; an emitter semiconductor electrode formed on the emitter; a passivation film entirely covering the resulting structure; an emitter electrode, a base electrode, and a collector electrode formed on the emitter semiconductor electrode, the base ohmic electrode, and the collector sinker, respectively.

DETAILED DESCRIPTION OF THE PRESENT INVENTION

Referring to figures, the detailed methods for manufacturing a bipolar transistor will be explained, hereinafter according to preferred embodiments of the present invention.

Preferred Embodiment 1

Figure 1A:
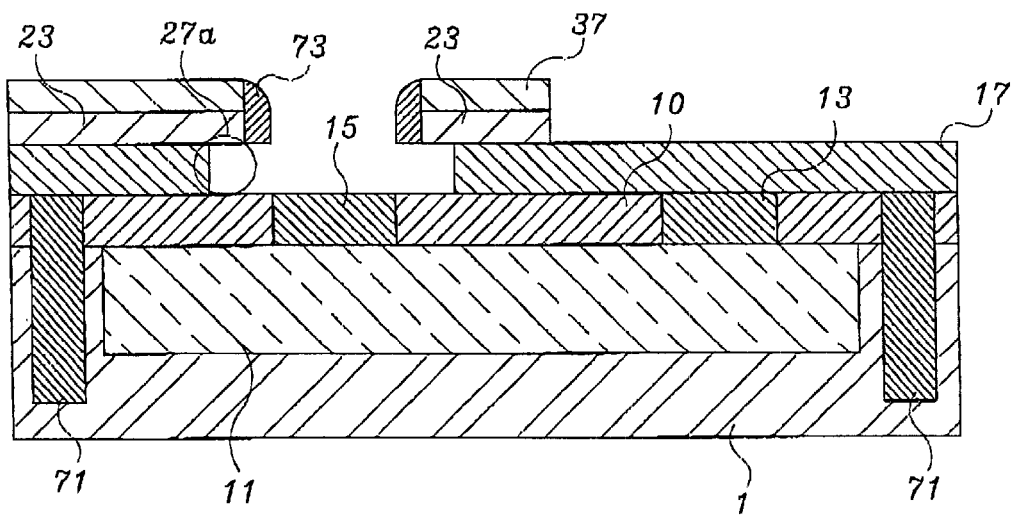
FIGS. 1a and 1b are cross-sectional views showing a super self-aligned heretojunction bipolar transistor (HBT) in which the base layer is formed by selective epitaxial growth of SiGe on the exposed silicon collector surface.
Figure 1B:
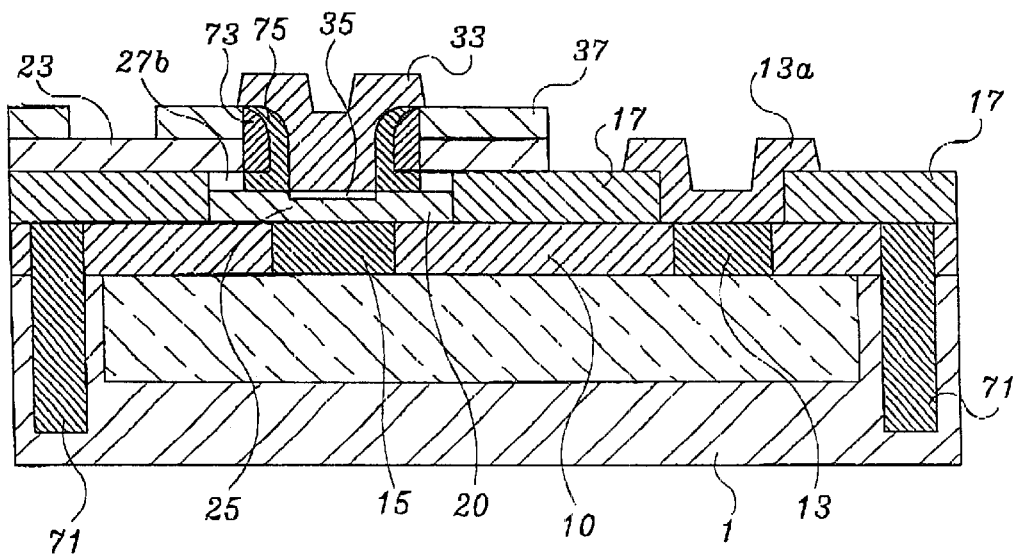
Figure 2A:
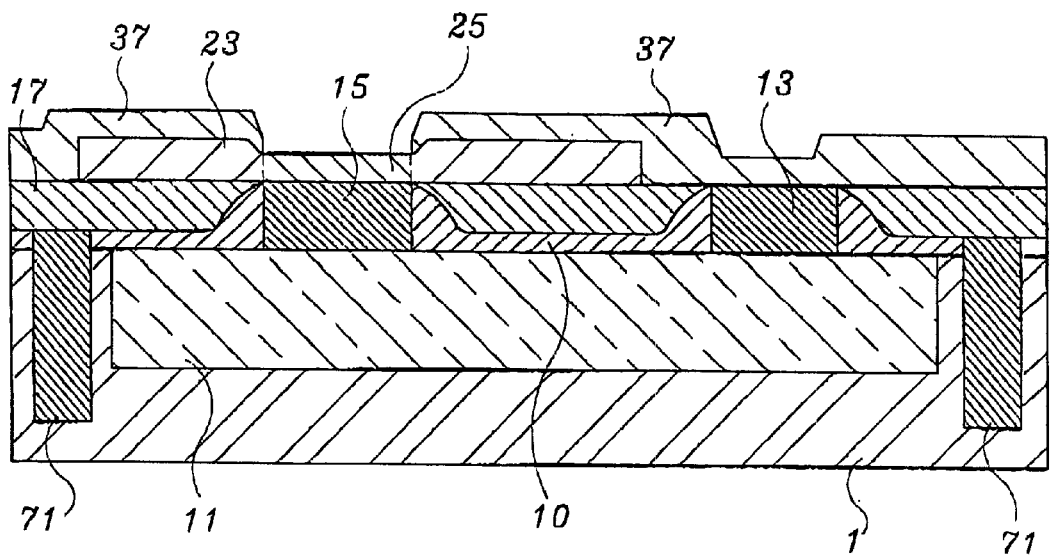
FIGS. 2a and 2b are cross-sectional views showing an SiGe HBT having a titanium disilicide base ohmic electrode and an SiGe base layer.
Figure 2B:
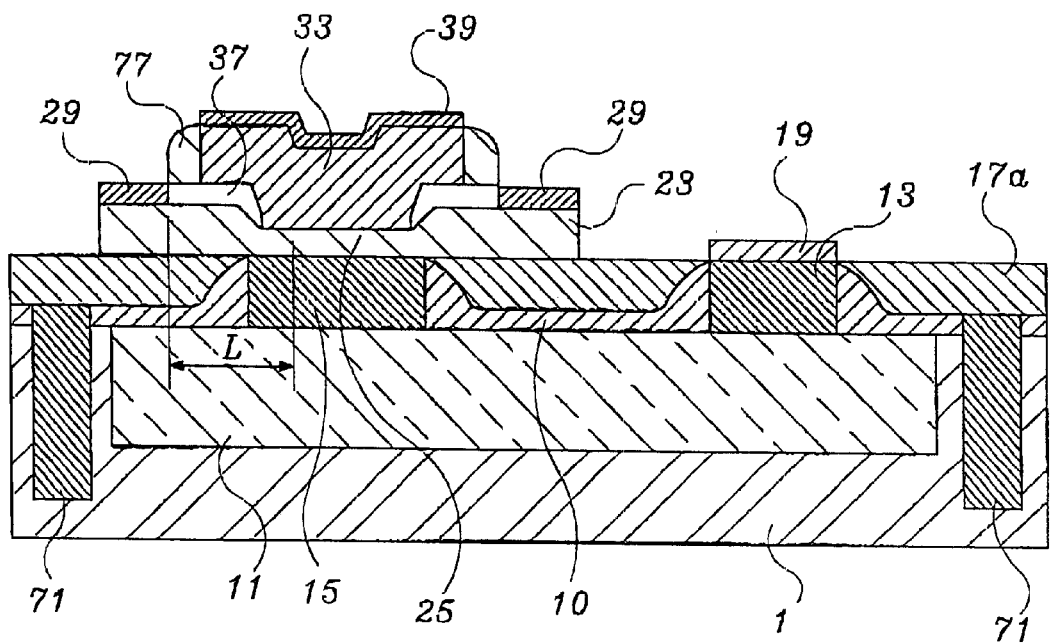
Figure 3A:
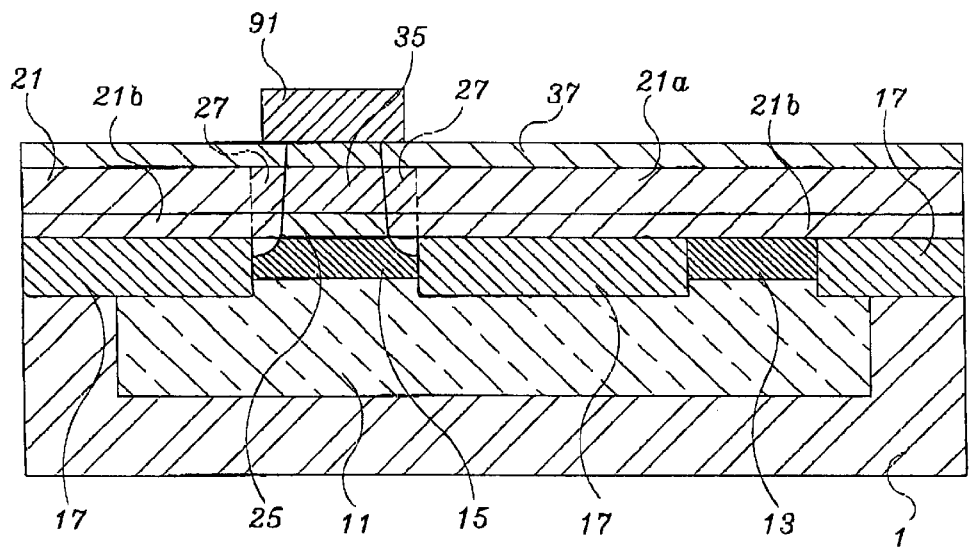
FIGS. 3a–3c are cross-sectional views showing a self-aligned SiGe base HBT having a titanium disilicide base ohmic electrode and an SiGe base layer.
Figure 3B:
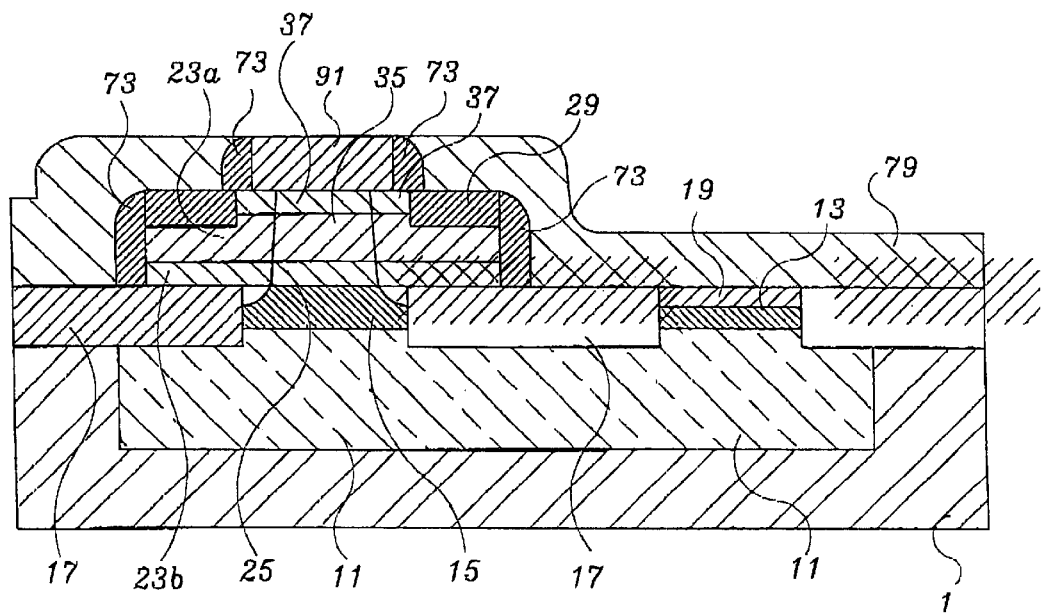
Figure 3C:
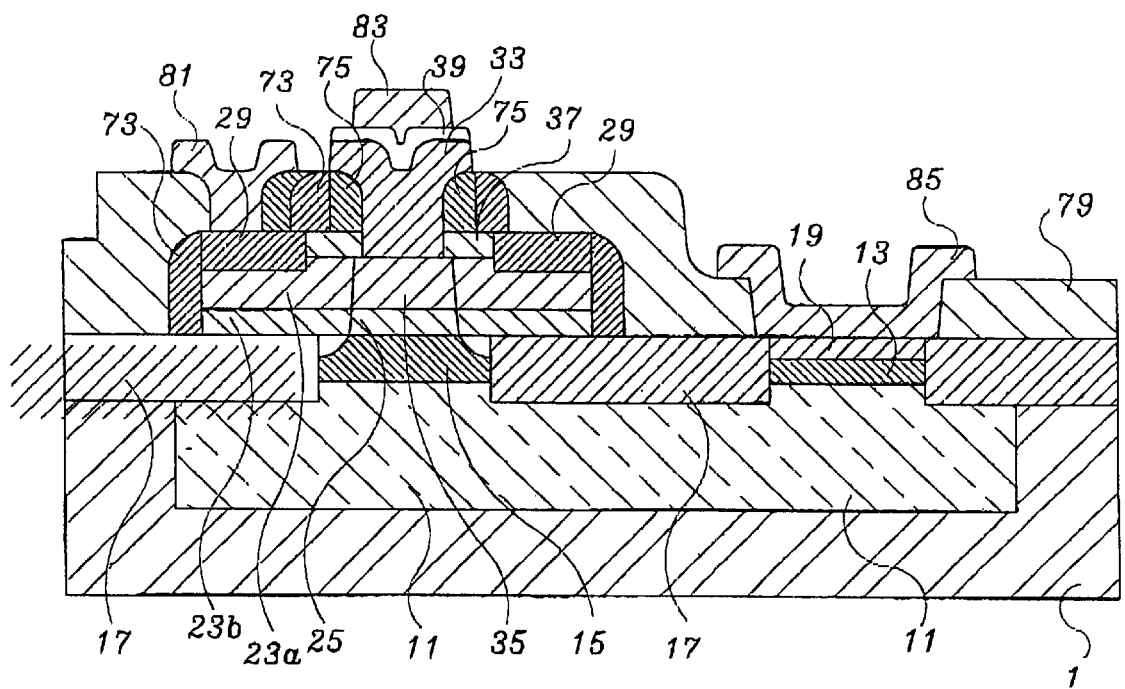
Figure 4A:
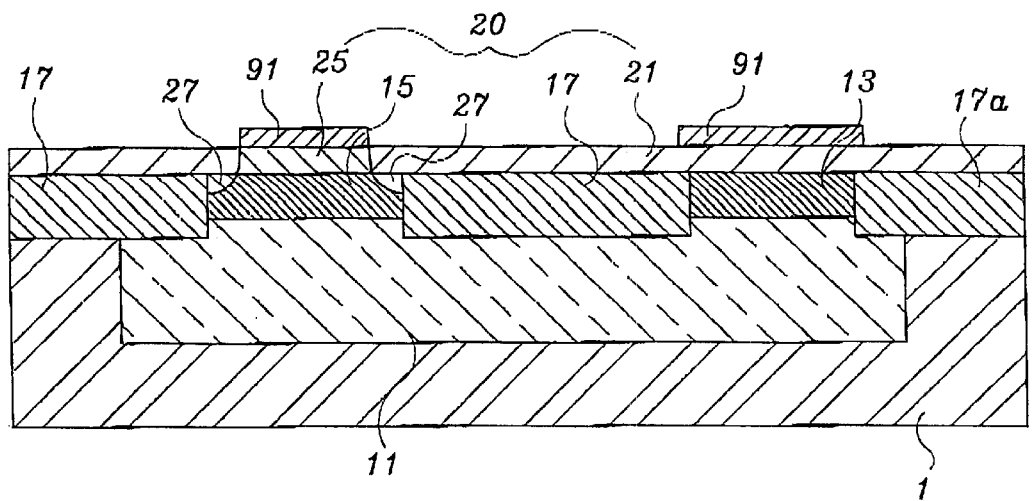
FIGS. 4a and 4b are cross-sectional views showing a SiGe HBT having a titanium disilicide base ohmic electrode and an SiGe base layer.
Figure 4B:
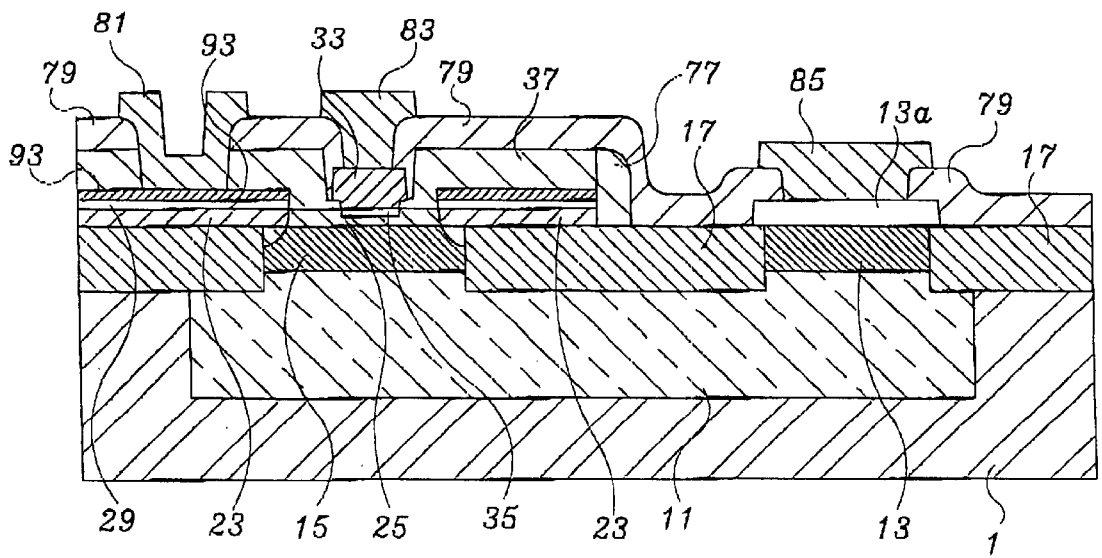
Figure 5A:
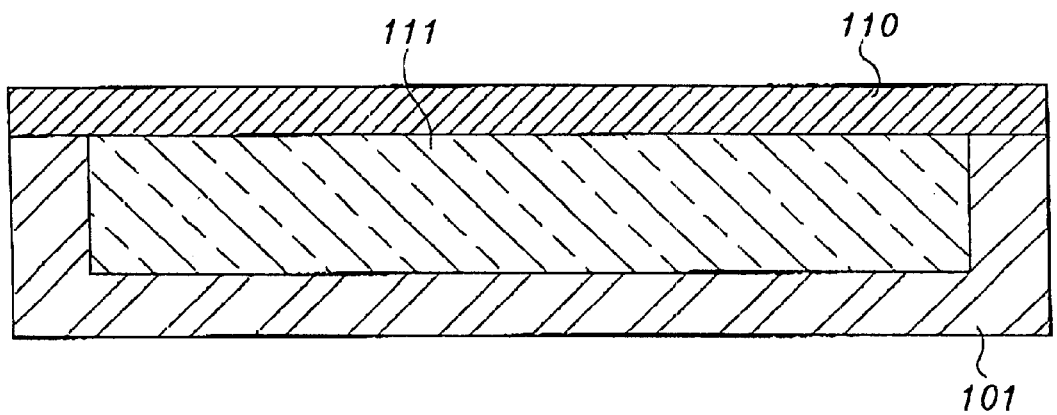
FIGS. 5a to 5g show sequential processing steps of manufacturing homojunction or heterojunction bipolar transistor having a metallic silicide base ohmic electrode and an Si- or SiGe-base layer according to the preferred embodiment 1 of the present invention.
Figure 5B:
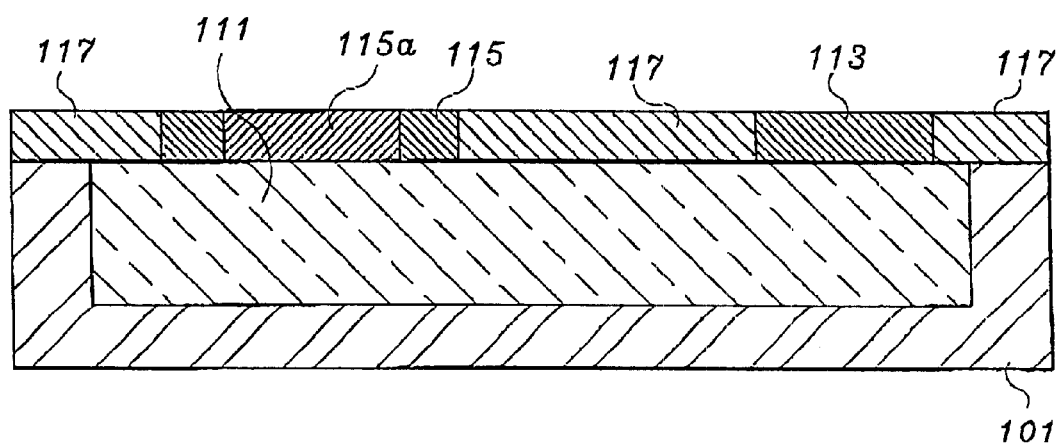
Figure 5C:
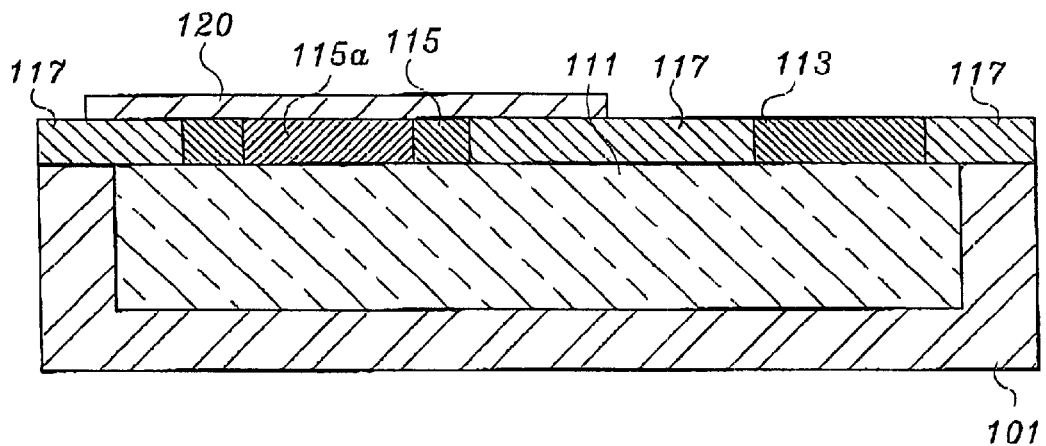
Figure 5D:
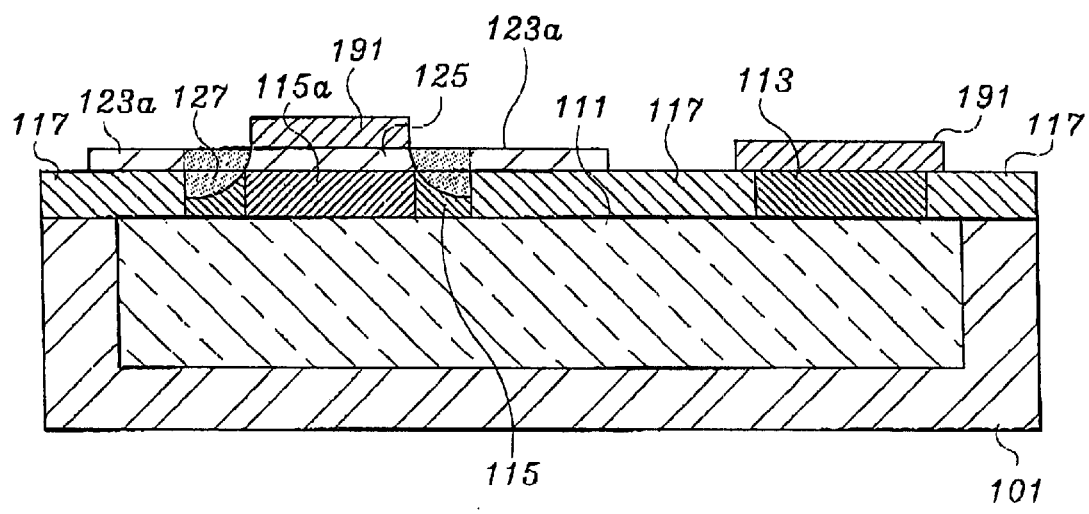
Figure 5E:
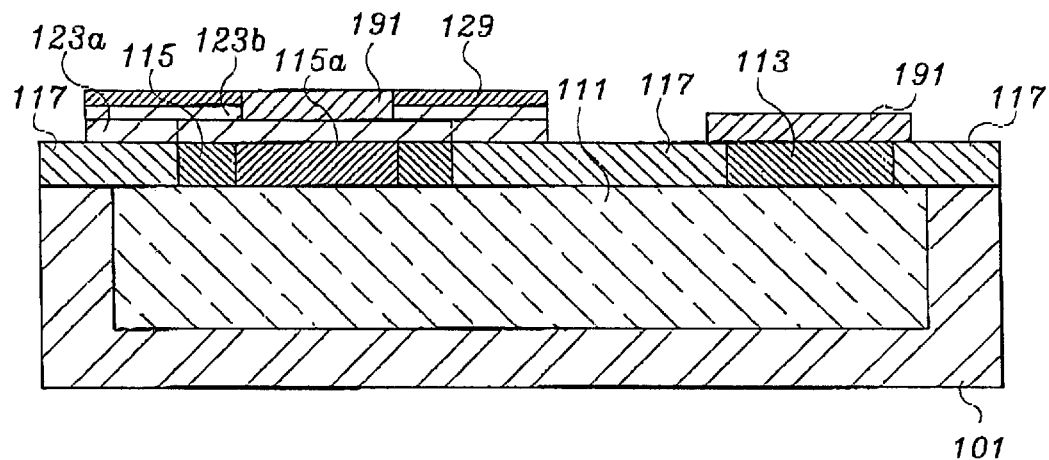
Figure 5F:
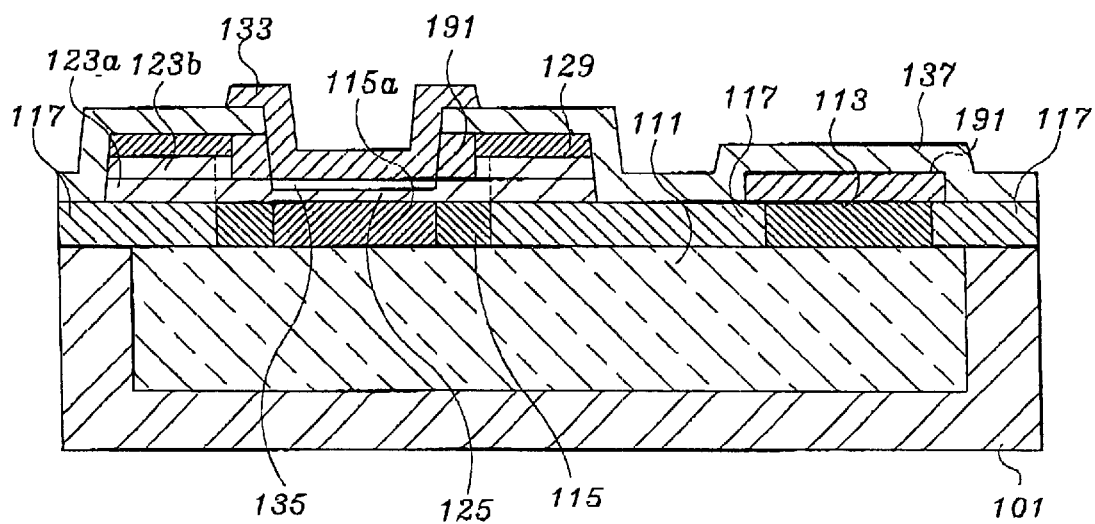
Figure 5G:
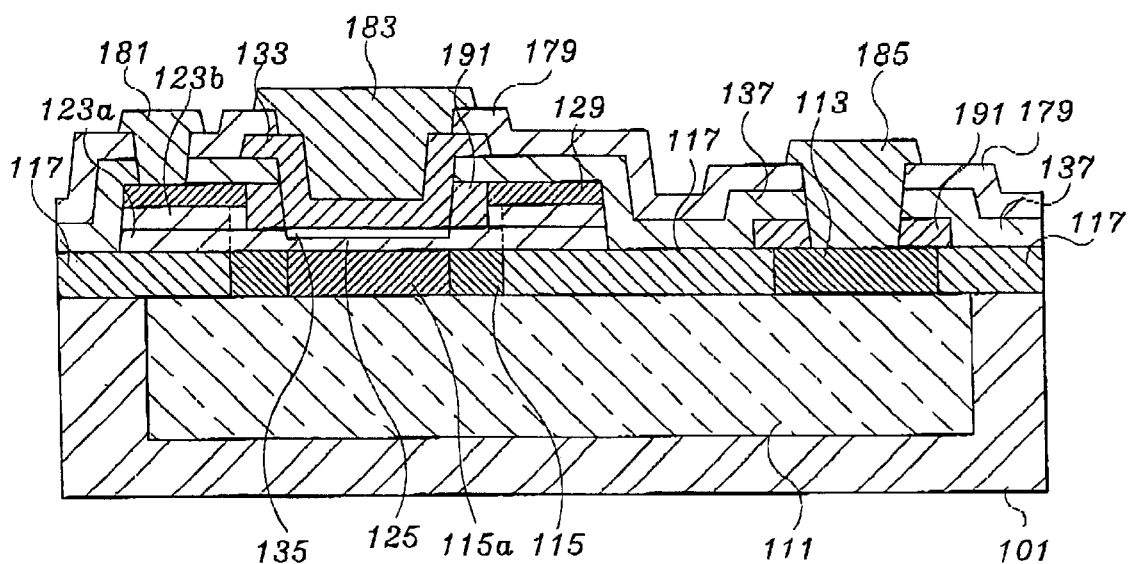

Referring to FIGS. 5a and 5g, method for manufacturing a bipolar transistor will be given in detail hereinafter according to the first preferred embodiment of the present invention.

An n+ buried collector 111 is formed by ion-implanting and diffusing n type impurities like arsenic or phosphorous on the p-silicon substrate 101, and a collector layer 110 is deposited thereon as shown in FIG. 5a.

A collector insulation layer (field oxidation film) 117 is formed on the region excluding the region which will become a collector region 115 and collector active region 115a, and a collector sinker 113 by thermal oxidation like the LOCOS process. Using a photo-mask opening the collector sinker 113, n type impurity like arsenic or phosphorous is implanted to make the collector sinker heavily doped. Then the photomask is stripped off an annealed to make the implanted impurity diffuse. An n− type impurity like arsenic or phosphorous is implanted into an area of intrinsic collector region 115 to form an active collector region 115a using a photo-mask Then the photomask is stripped off and thermal annealing is followed as shown in FIG. 5b.

A base layer 120 is deposited on the entire resulting substrate. The base layer 120 is a boron-doped silicon when a transistor is a homojunction bipolar transistor. In heterojunction bipolar transistor(HBT), the base layer 120 is a multi-layer structure comprising an undoped Si seed layer, an undoped SiGe film, a p+ SiGe film, and an undoped Si film from the bottom to the top. The Si seed layer enhances the uniformed nucleation of the SiGe film on the collector insulating film so the thickness of the base layer 120 and the boron concentration and the germanium composition in the base layer 120 are unified. In other words, the loading effect, in which the thickness of the base layer, the doping concentration and the Ge(Germanium) composition in the base layer vary according to the size of an opened Si area and the density of the opened Si pattern, does not occur. In addition, without the Si seed layer, the pressure at which the base layer is deposited should be lowered to the lower deposition rate as it is appropriate to have higher deposition pressure for higher throughput. That is, with the Si seed layer, deposition pressure of the base layer could be higher for higher throughput. The undoped Si layer at the top will be an emitter later on. The base layer 120 is patterned using a photomask which covers the base electrode region, as shown in FIG. 5c.

A masking film 191 which covers an active base region 125 and the collector sinker region 113 is formed by depositing and patterning with a photo-mask, as shown in FIG. 5d. The masking film comprises at least one of a silicon oxide and a silicon nitride. The masking film divides the base layer 120 into two parts; one is the active base region 125 and the other is a base semiconductor electrode region 123a, as shown in FIG. 5d. $BF_2$ ions are implanted using the masking film 191 so that the base layer 120 outside the masking film becomes a first base semiconductor electrode 123a with a higher boron doping concentration. Thermal annealing is followed and the implanted boron in the first base semiconductor electrode diffuses into the edge side 127 of the active collector 115.

Referring to FIG. 5e, an in-situ boron doped second base semiconductor electrode 123b is selectively deposited only on the first base semiconductor electrode 123a. The second base semiconductor electrode 123b comprises at least one from silicon, silicon-germanium, and germanium. Then, a base ohmic electrode 129 comprising a $TiSi_2$ and TiN is selectively formed only on the second base semiconductor electrode 123b by sputtering Ti and TiN sequentially and thermal annealing and wet etching. The base ohmic electrode 129 comprises at least one of metallic silicides such as $TiSi_2$, TiN, $CoSi_2$, $PtSi_2$, $NiSi_2$, $FeSi_2$, $CuSi_2$, $WSi_2$, etc. and metal as W, Cu, etc. The second base semiconductor electrode is to prevent electrical contact between the metallic silicide base ohmic electrode and the active collector region 115a. The electrical contact may be caused if the ultra-thin base is agglomerated with the metallic silicide base ohmic electrode. In other words, the agglomerated silicide penetrates the ultra-thin base layer to contact the collector region 115a and consequently a Schottky junction is formed between the base and the collector. In this case, asymmetry between the base-collector and the emitter-base junctions results in an undesirable offset collector-emitter voltage and thereby device performance degrades. As the base ohmic electrode 129 and the second base semiconductor electrode 123b are not formed on the active base region 125, the cut-off frequency is enhanced as the thickness of the active base region 125 is narrowed for there is no limit in thickness to prevent agglomeration.

Referring the FIG. 5f, an emitter insulation layer 137 is deposited entirely on the resulting substrate. Then, an emitter region is opened using a photomask by etching the emitter insulation layer 137 and the masking film 191. An n+ polysilicon is formed and patterned using a photomask which defines an emitter semiconductor electrode 133. Then, thermal annealing is followed. At this step, an n-type impurity in the emitter semiconductor electrode 133 diffuses to the adjacent active base layer underneath, i.e. an intrinsic base region, and consequently the undoped Si film at the upper-most part of the base layer 125 is converted to an emitter 135.

Referring to FIG. 5g, a passivation layer 179 with insulation material like silicon oxide or silicon nitride is deposited on the entire resulting substrate. Then, the opening of a contact window using a photo-mask is followed to form a base contact window on the base ohmic electrode 129, to form an emitter contact window on the emitter semiconductor electrode 133, and to form a collector contact window on the collector sinker 113. The opening of the contact window etches the passivation layer 179, emitter insulation layer 137, and the masking film 191 which covers the collector sinker 113. After cleaning the resulting substrate using a diluted HF solution, a metal electrode layer is deposited and patterned suing a photomask so that a base terminal 181, emitter terminal 183, and collector terminal 185 are formed as shown in FIG. 5g.

In case that the metallic silicide base ohmic electrode 129 is HF-soluble, the base ohmic electrode 129 can be etched during the dilute HF cleaning. In order to assure the connection between the base ohmic electrode 129 and the base terminal 181, an additional metallic silicide layer could be re-formed selectively on the exposed second base semiconductor electrode within the base contact window, before depositing the metal electrode layer.

Preferred Embodiment 2

Figure 6:
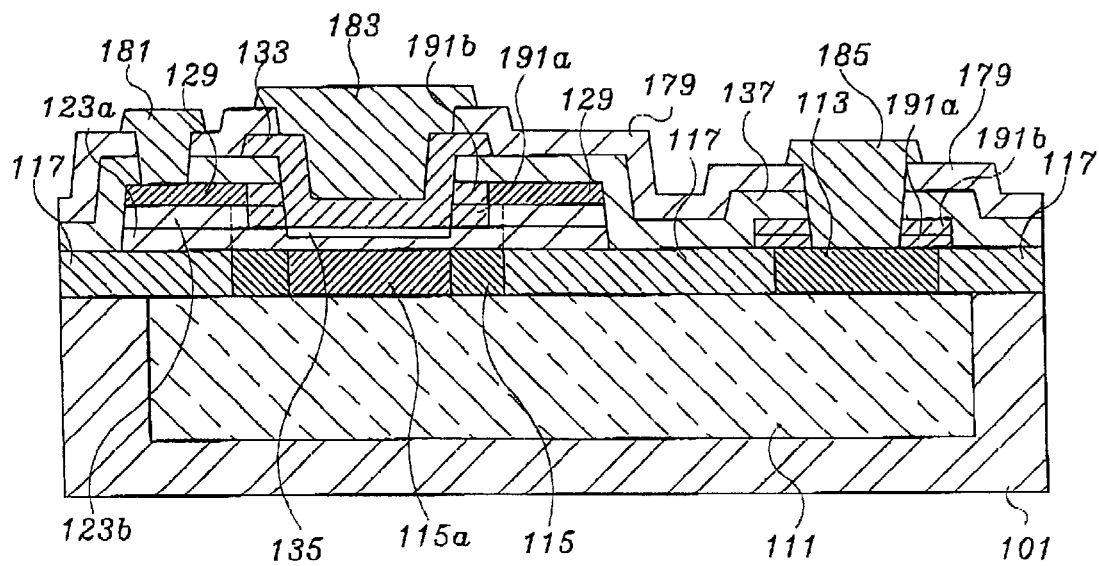
FIG. 6 is a cross-sectional view showing homojunction or heterojunction bipolar transistor having an Si- or SiGe-base layer according to the preferred embodiment 2 of the present invention.

In this preferred embodiment in FIG. 6, the masking film 191 covering the active base 125 and the collector sinker 113 comprises two layers; which are a silicon oxide bottom layer 191a and a silicon nitride top layer 191b. This is to avoid the damage on the base layer when opening the emitter window by etching the emitter insulation layer 137 and the masking film 191. By way of the reactive ion etching (RIE) rate difference between a silicon oxide and a silicon nitride, the RIE of the emitter insulation layer 137 stops at the silicon nitride layer 191b and then following another RIE of the exposed silicon nitride layer 191b stops at the silicon oxide bottom layer 191a. The exposed silicon oxide bottom layer is eliminated by chemical wet etching without damaging on the active base layer underneath.

Preferred Embodiment 3

In the preferred embodiment 1 of the present invention, the n type impurity in the heavily doped emitter semiconductor electrode with a doping concentration of ~$10^{21}$ cm$^{-3}$ is diffused into the undoped Si layer at the upper part of the base layer and the n+ emitter is formed. At the same time, the p type impurity in the p+ SiGe base with a doping concentration of ~$10^{19}$ cm$^{-3}$ is also diffused into the undoped Si layer. As a result, the n+p emitter-base junction with a high junction capacitance is formed and consequently the cut-off frequency at the low collector current decreases.

In this preferred embodiment, a method of forming an emitter having a lower emitter-base junction capacitance and higher cut-off frequency at low collector current is presented. Details will be given hereinafter with reference to FIGS. 7a to 7c.

Figure 7A:
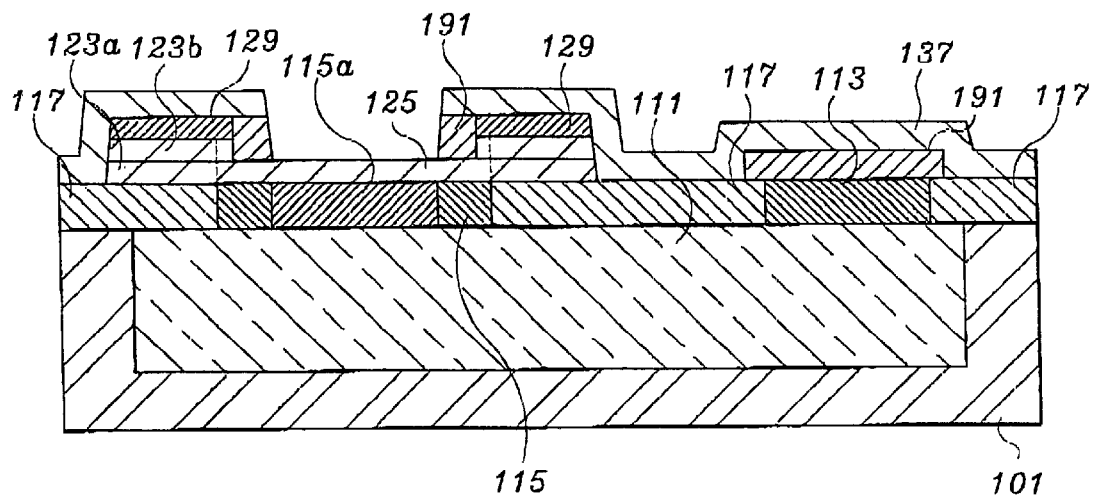
FIGS. 7a to 7c show the first example of sequential processing steps of manufacturing homojunction or heterojunction bipolar transistor having an Si- or SiGe-base layer according to the preferred embodiment 3 of the present invention.

In FIG. 7a, the base 125 comprises an undoped Si seed layer, an undoped SiGe layer, and a p+ SiGe layer from the bottom to the top however, the undoped Si layer at the top of the SiGe base of the preferred embodiment 1 is not included in this structure. The base 125 is exposed as the emitter region is opened by etching the emitter insulation layer 137 and the masking film 191 after the step shown in FIG. 5e of the preferred embodiment 1.

Figure 7B:
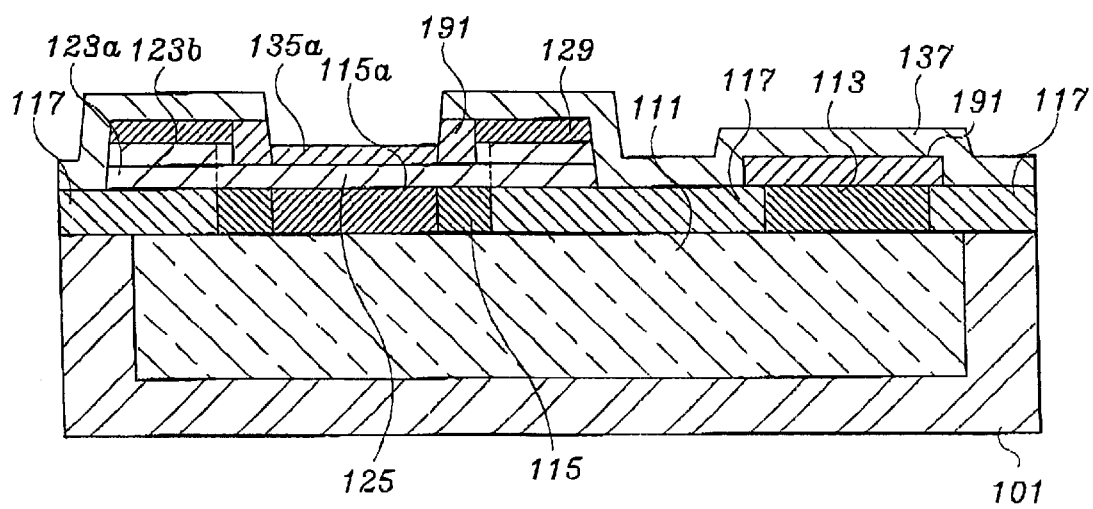

In FIG. 7b, a phosphorous- or arsenic-doped single crystalline silicon emitter 135a with a doping concentration lower than ~$10^{18}$ cm$^{-3}$ is selectively grown only on the exposed base layer in the emitter region.

Figure 7C:
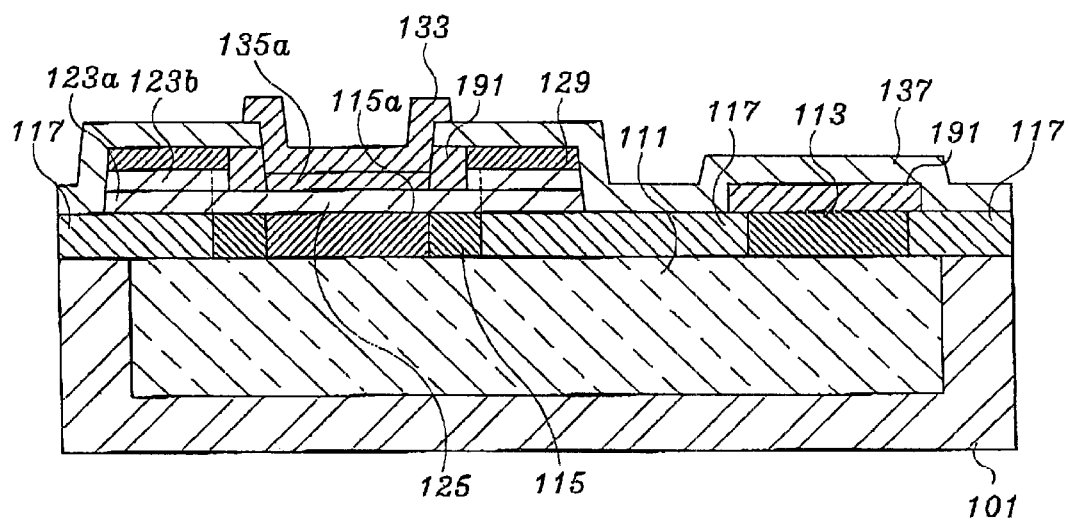

In FIG. 7c, an emitter semiconductor electrode 133 is formed by depositing and patterning a phosphorous- or arsenic-doped polysilicon.

Figure 8:
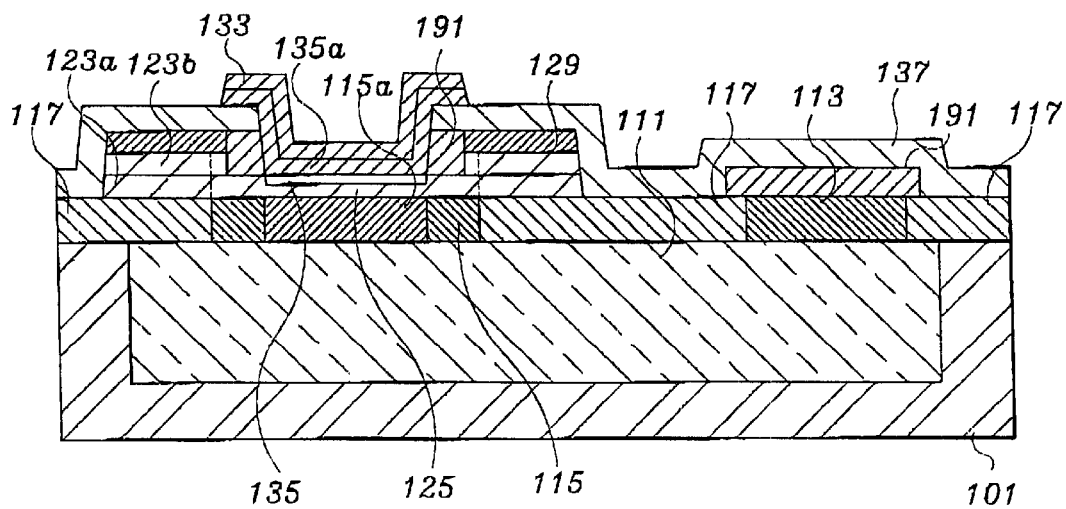
FIG. 8 is a cross-sectional view showing homojunction or heterojunction bipolar transistor having an Si- or SiGe-base layer according to the second method shown in the preferred embodiment 3 of the present invention.

Another manufacturing method for the emitter 135a and the emitter semiconductor electrode 133 according to the present embodiment can be applied. After the emitter region is opened, an n-type silicon emitter layer 135a with a doping concentration lower than ~$10^{18}$ cm$^{-3}$ and the n-type emitter semiconductor electrode 133 with a doping concentration of ~$10^{21}$ cm$^{-3}$ are deposited sequentially on the entire substrate instead of growing only the emitter layer 135a selectively. Then the emitter layer 135a and the polysilicon emitter semiconductor electrode 133 are patterned together. In this case, as shown in FIG. 8, the bipolar transistor structure is formed.

Preferred Embodiment 4

Figure 9A:
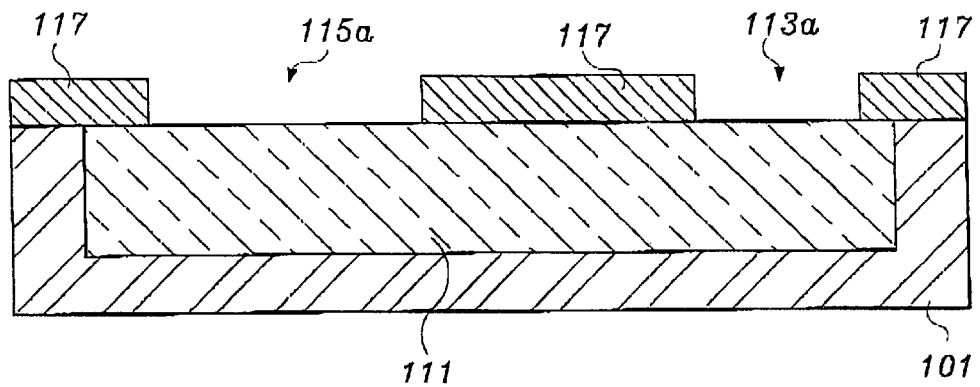
FIGS. 9a to 9c show sequential processing steps of manufacturing homojunction or heterojunction bipolar transistor having an Si- or SiGe-base layer according to the preferred embodiment 4 of the present invention.
Figure 9B:
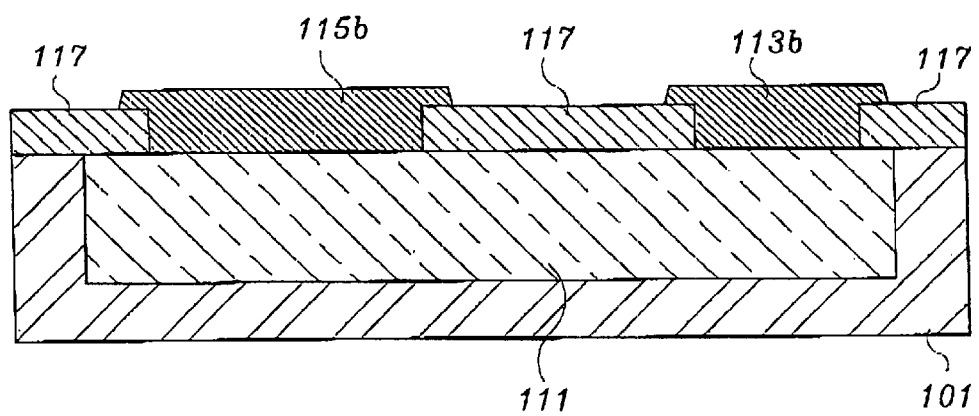
Figure 9C:
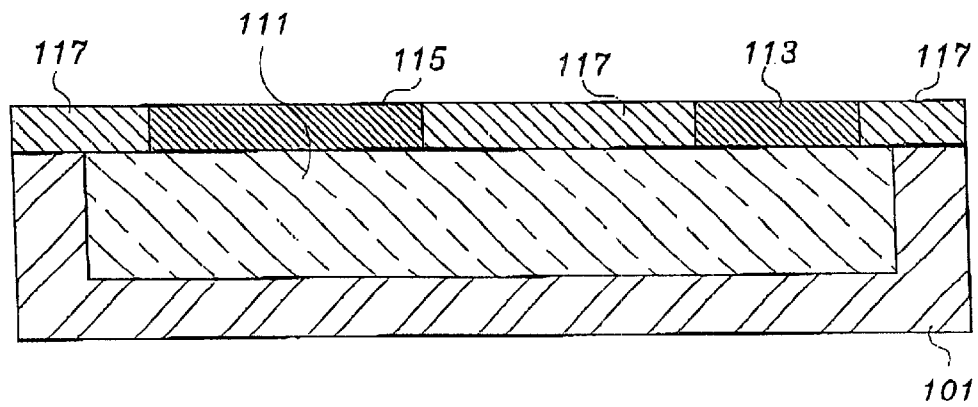

In this embodiment, unlike the way of forming the active collector as shown in the preferred embodiment 1, a different way of forming the active collector, so called LOCOS process, is presented with reference to FIGS. 9a to 9c.

In FIG. 9a, the collector insulation layer 117 is deposited on the entire substrate in which the buried collector 111 is formed. The active collector region 115a and the collector sinker region 113a are defined and exposed by etching the collector insulation layer 117 using a photomask which opens the collector active region and collector sinker region.

In FIG. 9b, single crystalline silicon films 115b and 113b are selectively grown simultaneously only on the exposed silicon of the collector region and collector sinker region. The single crystalline silicon films 115b and 113b are overgrown than the collector insulation layer 117 in general, in order to completely fill the opened regions.

In FIG. 9c, the protruded part of the overgrown silicon films 115b and 113b is planarized by a CMP. As a result, the collector insulation layer 117, the active collector 115 and the collector sinker 113 are formed. Following processes hereinafter is the same as that in the preferred embodiment 1.

While the present invention has been described with respect to certain preferred embodiments, other modifications and variations may be made without departing from the scope of the present invention as set forth in the following claims.

The present invention provides homojunction bipolar transistor or heterojunction bipolar transistor using in-situ doped ultra thin epitaxial silicon or SiGe base layer. Therefore, the base layer of the bipolar transistor in the present invention is thinner than that formed by ion-implantation and as a result, the cut-off frequency($f_T$) and maximum oscillation frequency($f_{max}$) are increased. In general, a SiGe layer is unlikely to be nucleated when it is grown on a field oxide. Due to this fact, the SiGe base layer is likely to be selectively grown only on the active collector of the field oxide-patterned substrate. As a result, it could be thicker than the critical thickness which is defined as a thickness limit of defect-free strained SiGe layer on a Si layer at different Ge contents. Therefore, the strain relaxation resulting in dislocation defect in the SiGe layer happens so that the SiGe HBT is failed. In order to overcome this drawbacks the seed layer comprising silicon with a pre-determined thickness is firstly grown on the oxide-patterned substrate and then the SiGe base layer is grown thereon. In this case, the SiGe base layer becomes more uniformed in thickness and the Ge composition together with doping concentration. In addition, the production yield increases by using this method of the present invention compared to using the conventional method in which the SiGe base layer is grown by using the selective epitaxial growth having a lower growth rate and complicated process steps.

In particular, when forming the TiSi$_2$ base ohmic electrode selectively not only on the exposed SiGe base layer in the active collector region but also on the first base semiconductor electrode on the field oxide, the TiSi$_2$ may permeate the base layer and contact the active collector due to the agglomeration of the TiSi$_2$. In this case, the performance of the device is degraded. In order to prevent this from happening, the in-situ doped second base semiconductor electrode is selectively grown only on the region where the base ohmic electrode is to be formed. Safety and reliability of processing step is achieved. In order to lower the thermal budget of the manufacturing process, the heavily in-situ doped emitter semiconductor electrode is formed. As a result, the diffusion of the dopant in the SiGe base layer into the adjacent silicon collector and silicon emitter is suppressed. Accordingly, the base is grown as thin as possible and the emitter-base junction capacitance is decreased so that lower noise and higher cutoff frequency could be achieved.

What is claimed is:

1. A bipolar element comprising:

a collector formed of a doped first type of semiconductor material;

a base formed of a second type semiconductor material in a base region of a base layer and contacting the collector;

a first base semiconductor electrode formed of a doped second type of semiconductor material disposed on said base layer and extending to the lateral sides of the base region;

a masking layer defining the first base semiconductor electrode and an emitter region by covering the base region;

a second base semiconductor electrode selectively formed on the first base semiconductor electrode;

a base ohmic electrode formed on the second base semiconductor electrode;

an emitter insulating layer covering the base ohmic electrode and portions of the masking layer;

an emitter formed of the first type of semiconductor material and contacting the base in an emitter region which is defined by an opening in the emitter insulating layer and the masking layer and;

an emitter semiconductor electrode formed of the doped first type of semiconductor material and contacting the emitter.

2. The bipolar element according to claim 1, wherein the base region includes:

an in-situ doped base layer forming said base and;

said emitter, said emitter having been formed by an undoped semiconductor material deposited on the in-situ doped base layer.

3. The bipolar element according to claim 1, wherein the base region includes:

a seed layer;

an undoped layer formed by an undoped silicon-germanium and disposed on the seed layer;

a doped layer formed by an in-situ doped silicon-germanium and disposed on the undoped layer and;

an emitter layer formed by an undoped semiconductor material disposed on the doped layer.

4. The bipolar element according to claim 1, wherein the masking layer includees:

a first masking layer formed of a silicon oxide and;

a second masking layer formed of a silicon nitride.

5. The bipolar element according to claim 1, wherein the emitter semiconductor electrode includes two contacting layers of the first type of doped semiconductor material disposed within the emitter region.

6. The bipolar element according to claim 1, wherein the emitter semiconductor electrode includes:

a first emitter layer formed of a doped first type of semiconductor material and; and a second emitter layer formed of a more heavily doped first type of semiconductor material.

* * * * *